United States Patent [19]
Clark et al.

[11] Patent Number: 5,142,268
[45] Date of Patent: Aug. 25, 1992

[54] ELIMINATION OF DISCRETE CAPACITORS IN R/C NETWORKS

[75] Inventors: Nelson T. Clark; Dennis Raesner, both of Berne; Ronald J. Dedert, Geneva, all of Ind.

[73] Assignee: CTS Corporation, Elkart, Ind.

[21] Appl. No.: 476,819

[22] Filed: Feb. 7, 1990

[51] Int. Cl.⁵ .............................................. H01C 1/06
[52] U.S. Cl. ...................................... 338/64; 338/60; 338/61; 338/320; 361/424
[58] Field of Search .................. 338/320, 47, 60, 260, 338/61, 64, 205, 299, 308; 361/424, 402, 400, 421, 414; 174/35 R, 35 MS; 29/610.1, 620

[56] References Cited

U.S. PATENT DOCUMENTS

| | | |
|---|---|---|
| 2,665,376 | 1/1954 | Kodama . |
| 3,273,027 | 9/1966 | Bourgault et al. . |
| 3,402,372 | 9/1968 | Wasyluk . |
| 3,821,610 | 6/1974 | Harcombe ............................ 361/421 |
| 3,983,528 | 9/1976 | King ................................. 338/320 X |
| 4,302,737 | 11/1981 | Kausche et al. ...................... 333/172 |
| 4,378,537 | 3/1983 | Scandurra .............................. 338/64 |
| 4,412,183 | 10/1983 | Brodie ................................. 338/60 X |
| 4,626,804 | 12/1986 | Risher et al. .......................... 338/260 |
| 4,801,489 | 1/1989 | Nakagawa et al. ............... 361/424 X |
| 4,954,929 | 9/1990 | Baran .................................. 361/414 |

*Primary Examiner*—Marvin M. Lateef
*Attorney, Agent, or Firm*—Albert W. Watkins

[57] ABSTRACT

The resistor network of the present invention uses nodal common points with branch conductors for distribution of electrical power to a plurality of resistors. Separating the branch conductors are electromagnetic shields which isolate individual resistors and branch conductors so as to reduce crosstalk between resistors. Additionally, resistors are alternately patterned upon each side of a substrate in order to further reduce crosstalk.

8 Claims, 4 Drawing Sheets

ELIMINATION OF DISCRETE CAPACITORS IN R/C NETWORKS

BACKGROUND OF THE INVENTION

1. Field Of The Invention

This invention pertains to resistor networks and particularly to improvements in crosstalk characteristics of resistor networks.

2. Description Of The Related Art

The application of smaller geometries and higher operating frequencies in electronic circuitry results in undesirable crosstalk between neighboring components. Resistor networks which have resistors grouped together on a common substrate have had a significant problem with high frequency crosstalk. To reduce crosstalk, manufacturers of resistor networks have incorporated discrete capacitors into the resistor network in order to lower the crosstalk between adjacent resistors. This is illustrated in U.S. Pat. No. 4,626,804 to Risher et al. The discrete capacitors lower crosstalk by coupling signals which might otherwise produce crosstalk to ground, thereby attenuating the undesirable signal. R/C networks have only been used in those applications which would be detrimentally affected by crosstalk because the cost of adding the discrete capacitor is substantial.

The provision of a discrete capacitor is expensive for several reasons. The manufacturer of resistor networks is seldom also the manufacturer of discrete capacitors and must incur extra materials expense acquiring capacitors. The handling of discrete capacitors is very different from standard screen printing operations and thereby adds to manufacturing expense. The discrete capacitor has dimensions which are very different from screen printed conductors and resistors and therefore requires special substrates or larger dimensions for inclusion in the network. Each of these complications adds to the expense of the network, which in turn limits applications and reduces sales of R/C networks. Lowered sales means lowered production volume thereby increasing expense further. Because of these disadvantages, manufacturers have avoided the inclusion of capacitors with resistor networks in every possible instance.

In order to overcome the limitations imposed by discrete capacitors, manufacturers have considered several options. The first is to screen print a capacitor. However, screen printed dielectrics are unusual and more costly. The extra printing and firing steps required to print the conductive for the capacitor, then the dielectric, and then the top conductive directly increases cost through additional processing steps and indirectly increases cost by lowering yield. The amount of capacitance of the screen printed capacitor is difficult to control, since screen printing thicknesses are far from precise and the resulting dielectric may be of widely varying thickness. Trimming of a screen printed capacitor is not as rapid or simple an operation as trimming a resistor. There are three layers which will be affected as opposed to one, and the electronics necessary to control the trimming operation is more complicated and generally slower. Each of these factors contribute to making the use of thick film screen printed capacitors undesirable.

Where large values of capacitance are not needed, Kodama in U.S. Pat. No. 2,665,376 teaches the use of screen printed capacitors using the substrate as the dielectric and distributed capacitive shields to reduce intercapacitive coupling between capacitors in a capacitive network. This is disclosed in reference to a capacitor network.

Additional examples of distributed capacitors in combination with resistors are provided by Wasyluk in U.S. Pat. No. 3,402,372 and Bourgault et al in U.S. Pat. No. 3,273,027.

SUMMARY OF THE INVENTION

The present invention overcomes the limitations of the prior art by eliminating or reducing common bus paths to lower inductive and resistive coupling, providing shields between conductive runs to lower capacitive coupling, and alternating sides of the substrate for positioning resistors as far apart as possible to lower electromagnetic coupling to a minimum. The application of resistors to alternate sides of the substrate also contributes to a reduction of common bus paths.

OBJECTS OF THE INVENTION

The present invention has the primary objective of lowering crosstalk to a minimum level. The present invention has the further objective of eliminating the need for discrete capacitors. These and other objectives are accomplished in accord with the present invention as described hereinbelow in regard to the preferred embodiment.

DESCRIPTION OF THE PREFERRED EMBODIMENT

Figure 1:
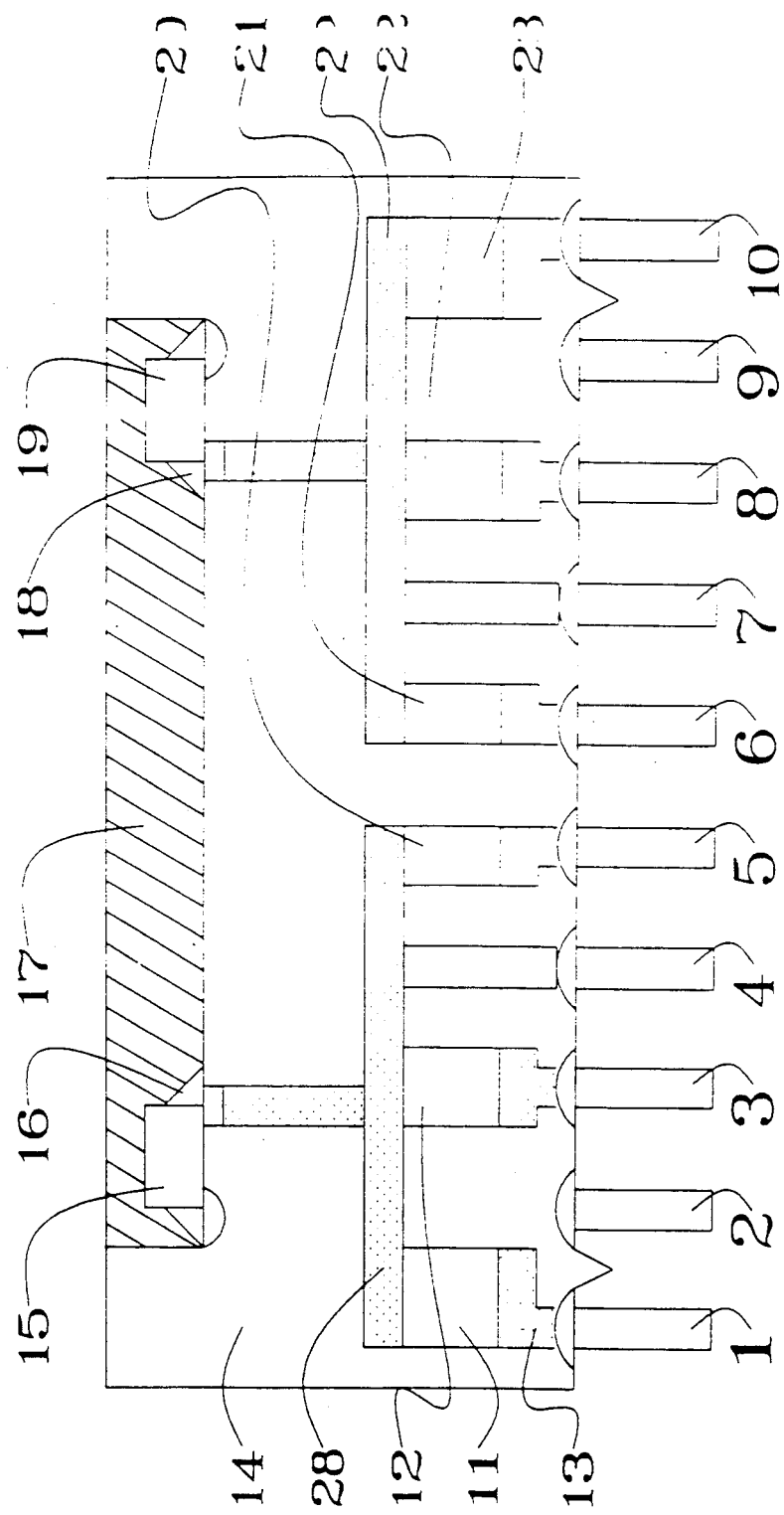
FIG. 1 illustrates a prior art resistor network from a top view.

FIG. 1 illustrates a prior art resistor network design. The resistors are formed upon a substrate 14 which may be a ceramic, glass, plastic or other material of suitable dielectric characteristics. Resistors 11, 12, 20, 21, 22, and 23 are formed upon substrate 14 by one of a variety of well known techniques such as screen printing or vapor deposition, and have electrically connected thereto conductors 13 which individually connect each resistor to one of pins 1-10. The network has two common pins, pin 4 which is common to resistors 11, 12 and 20 and pin 7 which is common to resistors 21-23. There are additionally two capacitors 15 and 19 which are coupled to common pins 4 and 7 respectively through common busses 28 and 29 respectively. Capacitors 15 and 19 may be chip type capacitors which are soldered to the resistor network at solder connections 16 and 18. The chip capacitors are further encapsulated to provide environmental protection by an encapsulant 17 which is typically an epoxy type material.

Figure 2:
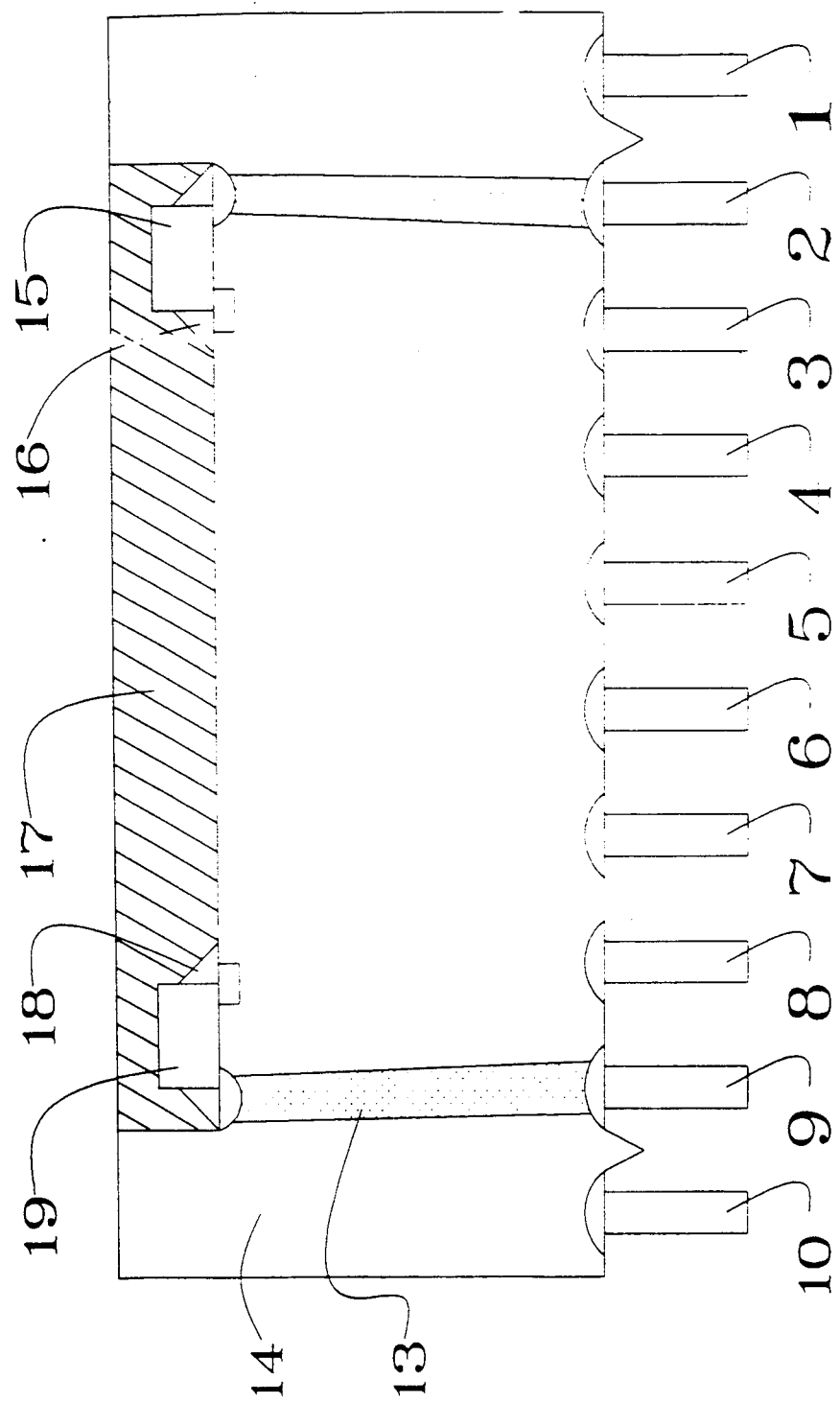
FIG. 2 illustrates the prior art resistor network of FIG. 1 from a bottom view.

Referring to FIG. 2 which illustrates the back side of the resistor network of FIG. 1, capacitors 15 and 19 are connected to terminals 2 and 9 respectively. These terminals are generally connected to an electrical ground. Unwanted AC signals such as crosstalk are coupled from busses 28 and 29 through capacitors 15 and 19 to pins 2 and 9 respectively. This capacitive coupling allows for a reduced crosstalk environment in a relatively close physical arrangement.

Figure 3:
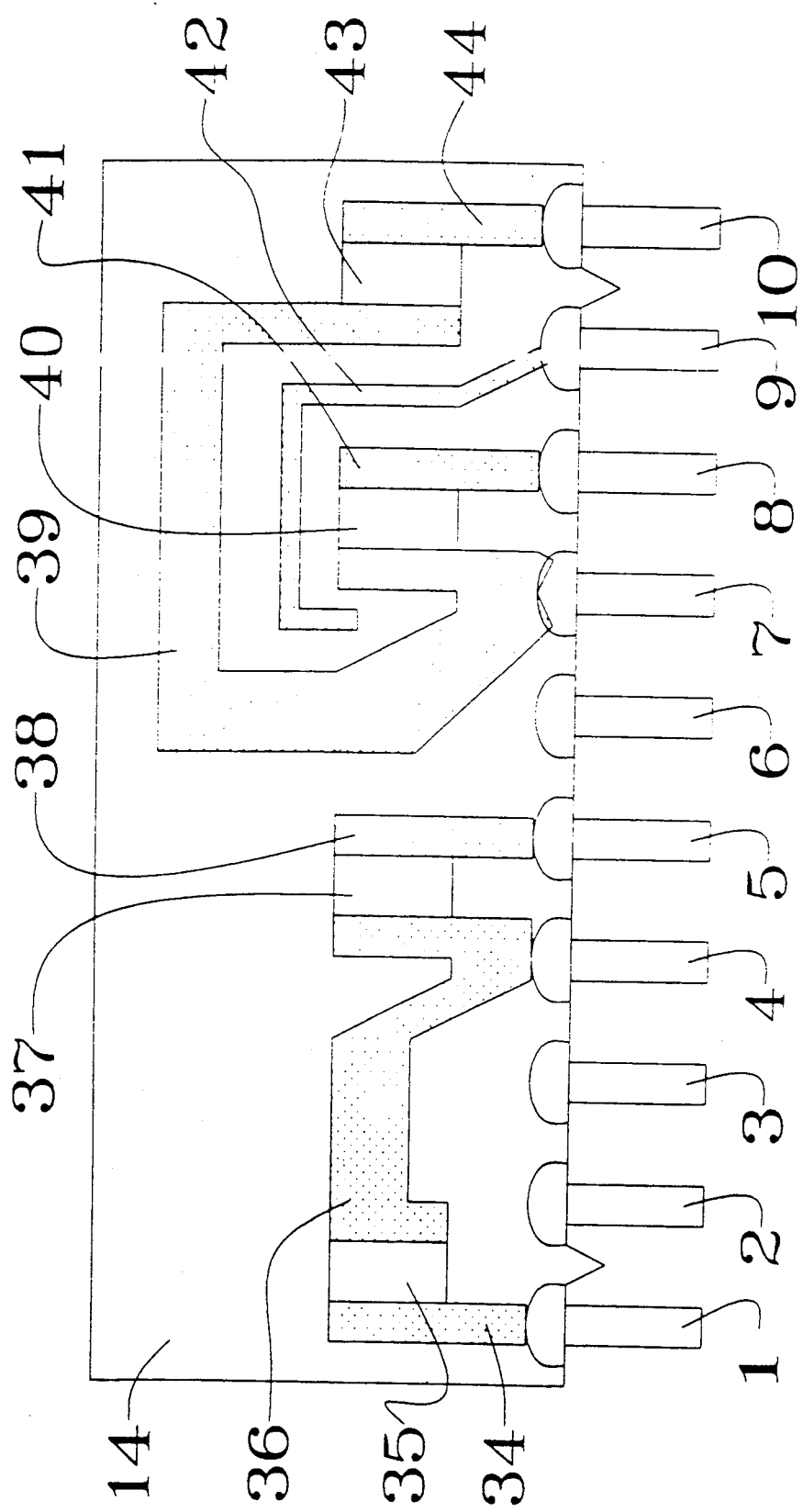
FIG. 3 illustrates the preferred embodiment of the present invention, a top view of the resistor network of FIG. 1 after redesign in accord with the present invention.
Figure 4:
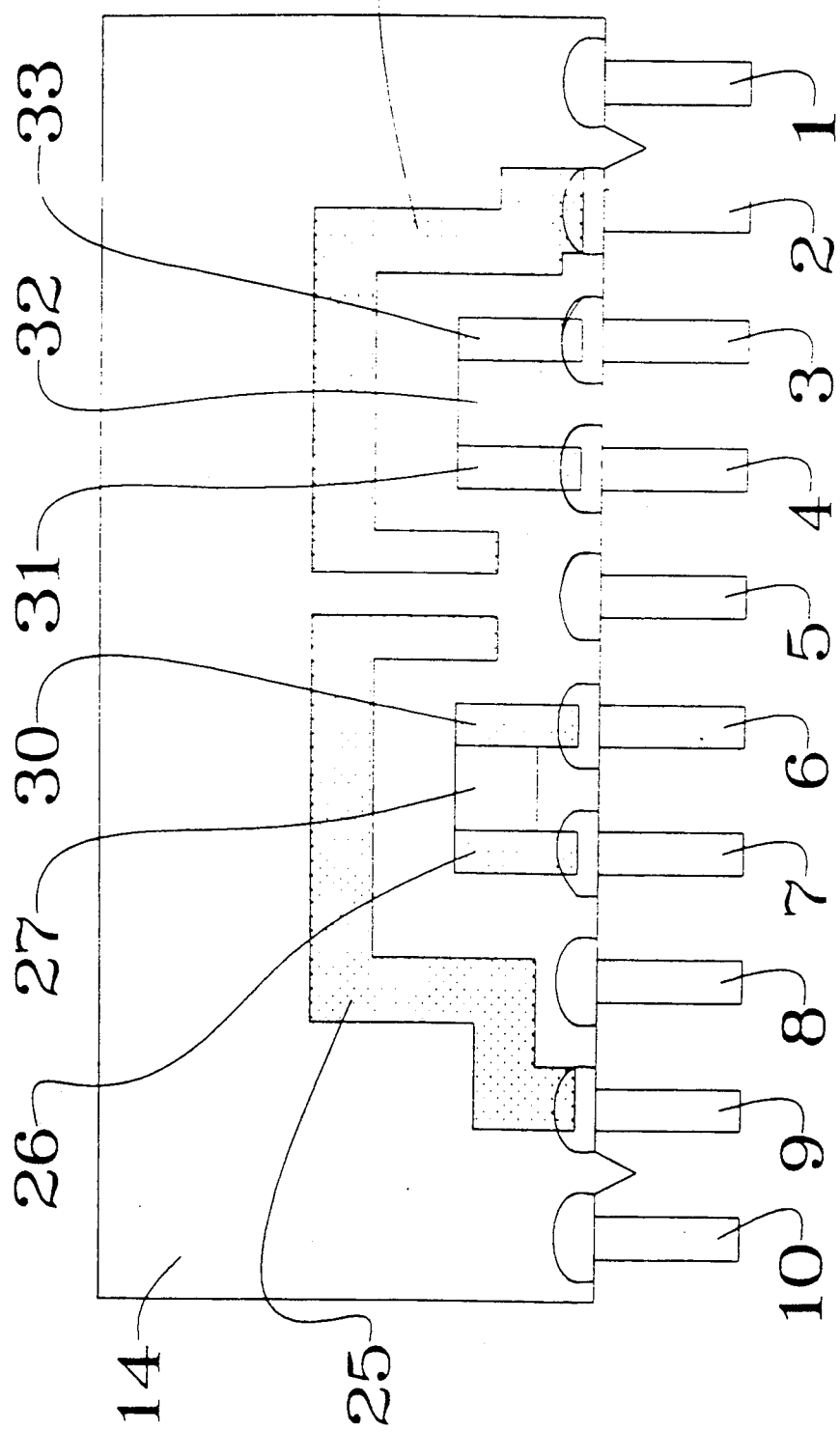
FIG. 4 illustrates a bottom view of the resistor network of the preferred embodiment.

FIGS. 3 and 4 illustrates the resistor network of the preferred embodiment of the present invention which is electrically very similar to the prior art network of FIGS. 1 and 2. Both sides of substrate 14 are used for circuit patterning, just as in the prior art figures. However, with the available space on substrate 14 created by the elimination of capacitors 15 and 19, there is extra available space for circuit patterning. Resistors 35, 37, 40, 43, 27, and 32 are of dimension comparable to the resistors illustrated in the prior art figure, and are similarly connected to common pins 4 and 7. There are additionally capacitive couplings to ground through shields 24, 25, and 42 (pins 2 and 9). This is where the similarity ends.

The circuit is formed entirely from patterning resistive and conductive material on substrate 14, without the inclusion of discrete capacitors 15 and 19. No dielectrics or multi-layer manufacturing techniques such as thick film capacitors are required. The space available by eliminating discrete capacitors 15 and 19 is used to improve the circuit layout to better performance beyond that which is attainable with discrete capacitors.

This is accomplished by varying greatly from standard circuit design and layout concepts. These prior art concepts teach the use of lower inductive reactance of each conductor by reducing the individual lengths of each bus and widening the conductive pattern to lower resistance, hence lowering impedance of the resistors to the common pins 4 and 7. Additionally, the prior art teaches that the conductives are preferably constructed using materials having as low a resistance as practical to further reduce the resistive component of the bus impedance. Capacitors 15 and 19 are provided roughly midway along conductive busses 28 and 29 to further reduce any coupling impedance between the capacitors and the buss which would adversely affect circuit performance. Risher et al in U.S. Pat. No. 4,626,804 illustrate these prior art teachings.

In the present invention several contrary approaches have been utilized with outstanding results. First, the common busses are eliminated to as great an extent as possible. In place of the common busses common nodes are utilized, with individual somewhat thinner conductors branching from each node to each individual resistor. Between each conductive branch a capacitive type shield is provided. This is illustrated in FIG. 3 where shield 42 separates resistor 40 and conductor 41 from conductor 39 to as great an extent as reasonably possible. Shield 42 minimizes electromagnetic coupling between conductor 39 and conductor 41-resistor 40. In FIG. 4, shields 24 and 25 shield resistors 27 and 32 respectively. The design of shields 24, 25, and 42 is done to minimize capacitive reactance between the shields and other components. This is contrary to the use of relatively large value discrete capacitors 15 and 19 of the prior art, and also to the teachings of Kodama et al earlier mentioned.

Finally, the six resistors are alternated from one side of substrate 14 to the opposite side. This further reduces capacitive crosstalk between components by maximizing component spacing and additionally further reduces the common bus, since resistor 27 approaches pin 7 through conductor 26 while resistors 40 and 43 approach pin 7 through conductor 39, thereby reducing the node size shared by all three resistors (27, 40, 43) to only pin 7.

While prior art circuit design techniques suggest that any efforts towards reducing the resistive components would be advantageous to reducing crosstalk, the present inventors have found that by using nodes and signal shields between each branch conductor as opposed to busses, the use of low resistance materials does not significantly improve performance. This may be advantageous where designers wish to continue to use relatively poor conductor materials such as nickel-chromium or palladium-silver (these materials having only a fraction the electrical conductivity of copper, gold, or silver).

EXAMPLE

Each of the following resistor networks were constructed using thick film screen print and fire techniques on an alumina substrate. Each of the devices was then measured for crosstalk using a 112 millivolt pulse 100 nanoseconds wide with a filtered minimum rise time of 1 nanosecond and additionally with an unfiltered 115 millivolt pulse produced by a Tektronix model 11802 oscilloscope. The pulse was applied across four resistors and the sum of each peak ac signal produced across another resistor was measured in millivolts. Several samples of each part were tested with similar consistent results.

The prior art resistor network illustrated in FIGS. 1 and 2 was constructed using palladium-silver thick film conductors, ruthenium dioxide thick film resistors, and chip type capacitors formed upon an alumina substrate. The first network is identified in table 1 as "Prior Art".

A second resistor network was produced in accord with the preferred embodiment of the present invention using palladium-silver thick film conductors and ruthenium dioxide thick film resistors. The second network is identified as "PM" in table 1.

A third resistor network was produced in accord with the preferred embodiment of the present invention using base metal conductors having a resistance approximately one-tenth the resistance of the palladium silver conductors used for the first and second networks. The third network additionally was manufactured from base metal resistors although the resistors in each network were laser trimmed to matching predetermined resistance values. The third network is identified as "BM" in table 1.

Both the base metal and precious metal varieties which incorporated the present invention far outperformed the prior art design without the need for discrete capacitors. The differences between the conductive materials used had very little influence over the final results of the networks which incorporated the present invention.

TABLE 1

| INPUT PINS | OUTPUT PINS | WITH FILTER | PRIOR ART | PM | BM |
|---|---|---|---|---|---|
| 3,5,6,8 | 1 | NO | 8.32 | 3.48 | 3.20 |
| 3,5,6,8 | 1 | YES | 2.90 | 1.22 | 1.16 |
| 10,6,5,3 | 8 | YES | 4.30 | 2.85 | 2.80 |

While the foregoing details what is felt to be the preferred embodiment of the invention, no material limitations to the scope of the claimed invention is intended. Further, features and design alternatives which would be obvious to one of ordinary skill in the art are considered to be incorporated herein. The scope of the invention is set forth and particularly described in the claims hereinbelow.

We claim:

1. A low crosstalk resistor network comprising:
   a substrate having a first substantially planar surface;
   a first resistor and a second resistor, said first and second resistors substantially co-planar upon said first substantially planar surface of said substrate and separated by a first space therebetween;
   a node electrically connected to a first branch conductor and a second branch conductor, said first branch conductor electrically connecting said node to said first resistor and said second branch conductor electrically connecting said node to said second resistor, said first and second branch conductors substantially co-planar upon said first substantially planar surface of said substrate and separated by a second space therebetween; and
   a first crosstalk reducing electrical shield interposed spatially between said first and second branches upon said first substantially planar surface of said substrate, said shield consuming a minor portion of said second space.

2. The low crosstalk resistor network of claim 1 wherein said substrate comprises a second planar surface substantially parallel to said first planar surface, said first and second planar surfaces having a dimension of length and a dimension of width, said dimensional axes of length on said first and said second planar surfaces being parallel and said dimensional axes of width on said first and said second planar surfaces being parallel, and wherein said substrate further comprises a third resistor supported upon said second planar surface, said third resistor spaced substantially equidistant between said first and second resistors in a geometric axis formed by a line drawn between said first and said second resistors within said first planar surface.

3. The low crosstalk resistor network of claim 2 wherein said first planar surface and said second planar surface comprise a majority of a total surface area of said substrate, and wherein said first and second planar surfaces are of generally rectangular configuration, said length axis being of greater magnitude than said width axis.

4. The low crosstalk resistor network of claim 3 wherein said geometric axis and said length axis are parallel.

5. The low crosstalk resistor network of claim 2 further comprising a fourth resistor supported upon said second planar surface spaced from said third resistor by a third space, said third resistor electrically connected to a third branch conductor and said fourth resistor electrically connected to a fourth branch conductor, said third branch conductor separated from said fourth branch conductor by a fourth space.

6. The low crosstalk resistor network of claim 5 further comprising a second crosstalk reducing electrical shield interposed spatially between said third and fourth branch conductors upon said second substantially planar surface of said substrate, said shield consuming a minor portion of said fourth space.

7. The low crosstalk resistor network of claim 1 wherein said first crosstalk reducing electrical shield is additionally interposed between said first and said second resistors and consumes a minor portion of said first space.

8. The low crosstalk resistor network of claim 6 wherein said second crosstalk reducing electrical shield is further interposed spatially between said third and fourth resistors, said shield consuming a minor portion of said third space.

* * * * *